(12) United States Patent
Ogawa et al.

(10) Patent No.: US 7,710,129 B2
(45) Date of Patent: May 4, 2010

(54) POTENTIAL MEASUREMENT APPARATUS AND IMAGE FORMING APPARATUS

(75) Inventors: Toshiyuki Ogawa, Tokyo (JP); Yoshitaka Zaitsu, Kawasaki (JP); Takashi Ushijima, Yokohama (JP); Atsushi Kandori, Ebina (JP); Kaoru Noguchi, Tokyo (JP); Kazuhiko Kato, Tokyo (JP); Futoshi Hirose, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 237 days.

(21) Appl. No.: 11/946,520

(22) Filed: Nov. 28, 2007

(65) Prior Publication Data

US 2008/0284445 A1    Nov. 20, 2008

(30) Foreign Application Priority Data

Dec. 13, 2006    (JP) ............................. 2006-335541

(51) Int. Cl.
*G01R 27/08* (2006.01)
*G01R 29/12* (2006.01)
*G01R 27/26* (2006.01)
*G03G 15/00* (2006.01)
*G01L 1/00* (2006.01)

(52) U.S. Cl. ................... 324/713; 324/457; 324/458; 324/686; 399/48; 73/763

(58) Field of Classification Search .............. 324/457, 324/458, 661, 679, 686, 713; 399/48; 73/760, 73/777

See application file for complete search history.

(56) References Cited

U.S. PATENT DOCUMENTS

| 4,047,144 | A | * | 9/1977 | Wong ......................... 73/777 |
| 4,166,269 | A | * | 8/1979 | Stephens et al. ............... 338/3 |
| 7,242,882 | B2 | | 7/2007 | Ichimura et al. |
| 2003/0042907 | A1 | * | 3/2003 | Kieres et al. ................. 324/458 |
| 2006/0171728 | A1 | | 8/2006 | Ichimura et al. |
| 2006/0267593 | A1 | | 11/2006 | Ichimura et al. ............ 324/452 |
| 2007/0051182 | A1 | * | 3/2007 | Egawa et al. .................. 73/777 |
| 2007/0154231 | A1 | | 7/2007 | Ichimura et al. |
| 2007/0170925 | A1 | | 7/2007 | Kandori et al. ............. 324/457 |

FOREIGN PATENT DOCUMENTS

| JP | 2981600 | 11/1999 |
| JP | 2004-301555 | 10/2004 |

* cited by examiner

*Primary Examiner*—Timothy J Dole
(74) *Attorney, Agent, or Firm*—Fitzpatrick, Cella, Harper & Scinto (57) ABSTRACT

A potential measurement apparatus is provided which can suitably maintain the oscillation state of an oscillator including a detection electrode and stably measure the potential of a measurement object. The potential measurement apparatus includes a bearing part, an elastic supporting part supported by the bearing part, an oscillator movably supported by the elastic supporting part, detection electrodes installed in the oscillator, a drive mechanism driving the oscillator and a signal detection unit. The signal detection unit is connected to the detection electrodes to detect electrical signals appearing in the detected electrodes. A stress detecting element for generating an electric signal according to the stress of the elastic suspension part 142 is provided.

8 Claims, 9 Drawing Sheets

POTENTIAL MEASUREMENT APPARATUS AND IMAGE FORMING APPARATUS

BACKGROUND OF THE INVENTION

1. Field of the Invention

The present invention relates to a potential measurement apparatus of a non-contact type measuring potential of a measurement object in a non-contact manner and an image forming apparatus including the potential measurement apparatus.

2. Description of the Related Art

Conventionally, in an image forming apparatus including a photosensitive drum to form an image with an electrophotographic system, it is necessary to charge the photosensitive drum to appropriate (typically uniform) potential under any environment in order to obtain stable image quality. Therefore, by measuring the charged potential of the photosensitive drum with a potential measurement apparatus and utilizing the results thereof, feedback control is carried out so as to keep the potential of the photosensitive drum uniform.

Figure 9A:
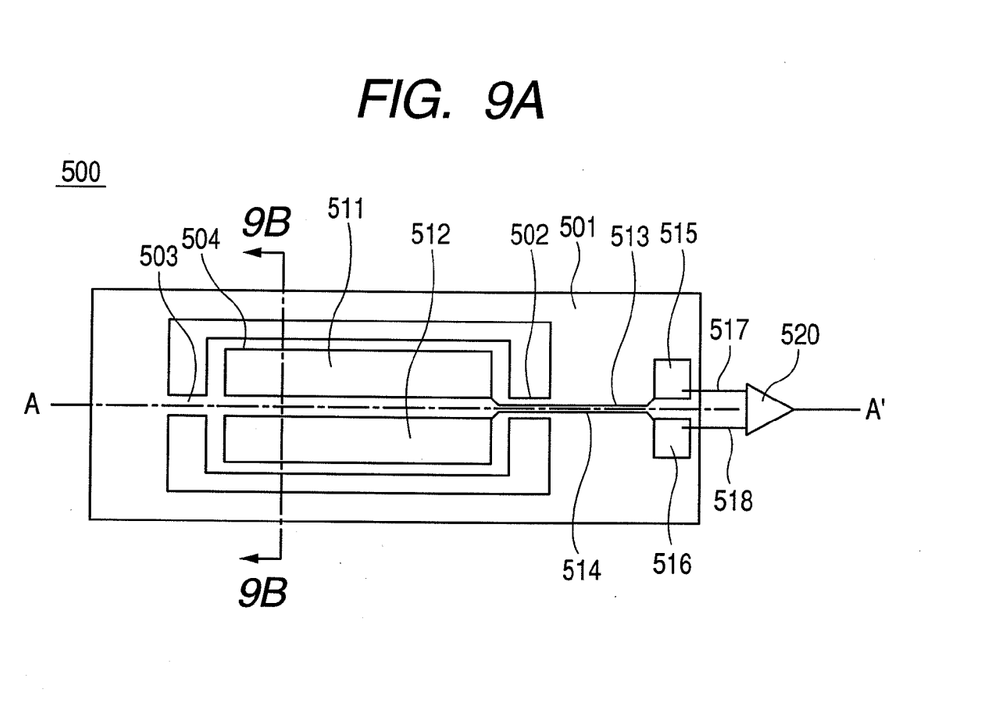
FIG. 9A and FIG. 9B are views for illustrating a potential measurement apparatus of prior art.
Figure 9B:
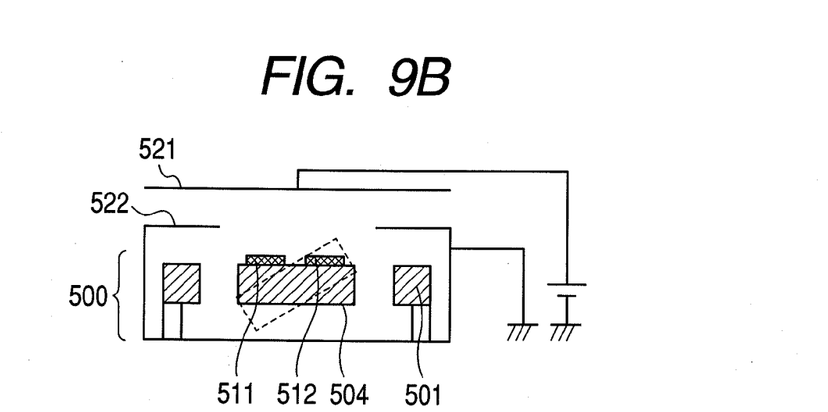

As a potential measurement apparatus used for an image forming apparatus, the following has been proposed (Japanese Patent Application Laid-Open No. 2004-301555). FIG. 9A illustrates a top view of the potential measurement apparatus 500. FIG. 9B illustrates a sectional view taken along the line 9B-9B in FIG. 9A. In the potential measurement apparatus 500, a cradle 504 and two torsion springs 502 and 503 are integrally formed with a bearing substrate. The cradle 504 has two detection electrodes 511 and 512. The cradle 504 is symmetrical about the center line A-A' in the longitudinal direction of the torsion springs 502 and 503. The detection electrodes 511 and 512 are so arranged as to be line symmetrical with respect to the center line A-A'. In addition, the detection electrodes 511 and 512 are respectively connected, through electrode wirings 513 and 514, to extraction electrodes 515 and 516 provided on the bearing substrate 501. Moreover, the extraction electrodes 515 and 516 are connected to a differential amplifier 520 through wirings 517 and 518.

A potential measurement method with the potential measurement apparatus 500 will be described with reference to FIG. 9B showing a sectional view taken along the line 9B-9B in FIG. 9A. The potential measurement apparatus 500 is set opposite to a measurement object surface 521. The measurement object surface 521 is, for example, a photosensitive drum. In addition, the potential measurement apparatus 500 is placed inside a case 522 which is electrically conductive and electrically grounded. A dashed line in FIG. 9B illustrates a state in which a cradle 504 is shaken by a cradle drive mechanism (not illustrated in the drawing). By periodically shaking the cradle 504, the distance between the detection electrodes 511 and 512 and the measurement object surface 521 and the coupling capacitance therebetween are periodically varied. Thereby, signal current containing information on the potential of the measurement object surface 521 can be taken out of the differential amplifier 520.

In addition, as a unit adjusting the resonance property of an oscillator connected to a fixed part through an elastic supporting part, an optical scanner provided with a spring constant variable element in the elastic supporting part has also been proposed (see Japanese Patent Publication No. 2981600).

The above described potential measurement apparatus involves the following problems. The shaking state of the cradle may change due to changes in environment when being used, which may inhibit the stability of potential measurement being improved. For example, when the temperature of environment when being used changes, the spring constant of the torsion spring may change, and then the resonance frequency may change. In addition, the optical scanner in the afore-mentioned prior art has nothing to do with potential measurement.

SUMMARY OF THE INVENTION

Accordingly, an object of the present invention is to provide a potential measurement apparatus and an image forming apparatus free from such problems as described above.

A potential measurement apparatus of the present invention includes a bearing part, an elastic supporting part supported by the bearing part, an oscillator movably supported by the elastic supporting part, a detection electrode installed in the oscillator, a drive mechanism driving the oscillator and a signal detection unit. The signal detection unit is connected to the detection electrode to detect electrical signals appearing in the detected electrode. Moreover, a stress detecting element for detecting an electrical signal generated according to the stress of the elastic supporting part is provided.

In the above described constitution, a stress measurement unit connected to the stress detecting element is provided. The stress measurement unit can control the drive mechanism based on the stress measurement results to adjust the oscillation state of the oscillator. Alternatively, an oscillation property control element changing the oscillation property of the oscillator can be provided. In this case, a stress measurement unit connected to the stress detecting element and an oscillation property control unit connected to the oscillation property control element can be provided to enable the stress measurement unit to control the oscillation property control element through the oscillation property control unit on the basis of the stress measurement results to adjust the oscillation state of the oscillator.

The image forming apparatus of the present invention is provided with the potential measurement apparatus and the image forming unit, wherein the image forming unit controls image formation by using signals obtained from the potential measurement apparatus.

The potential measurement apparatus of the present invention is provided with the stress detecting element as described above, and therefore, can detect the oscillation state of the oscillator on the basis of the electrical signals. Accordingly, for example, the drive frequency of the drive mechanism can be caused to follow a change in the resonance frequency of the oscillator and the oscillation property of the oscillator can be adjusted. Thus, the oscillation state of the oscillator can be suitably retained. Accordingly, for example, the resonance movement of the oscillator can be maintained. The displacement angle or deflection angle of the oscillator is kept at a maximum, whereby highly accurate potential measurement can become sustainable, and the potential measurement apparatus can be stably operated over a long period. In addition, using the potential measurement apparatus in an image forming apparatus, the image forming apparatus can be stably operated over a long period.

Further features of the present invention will become apparent from the following description of exemplary embodiments with reference to the attached drawings.

DESCRIPTION OF THE EMBODIMENTS

An embodiment of a potential measurement apparatus according to the present invention will be described below with reference to the drawings.

First Embodiment

Figure 1A:
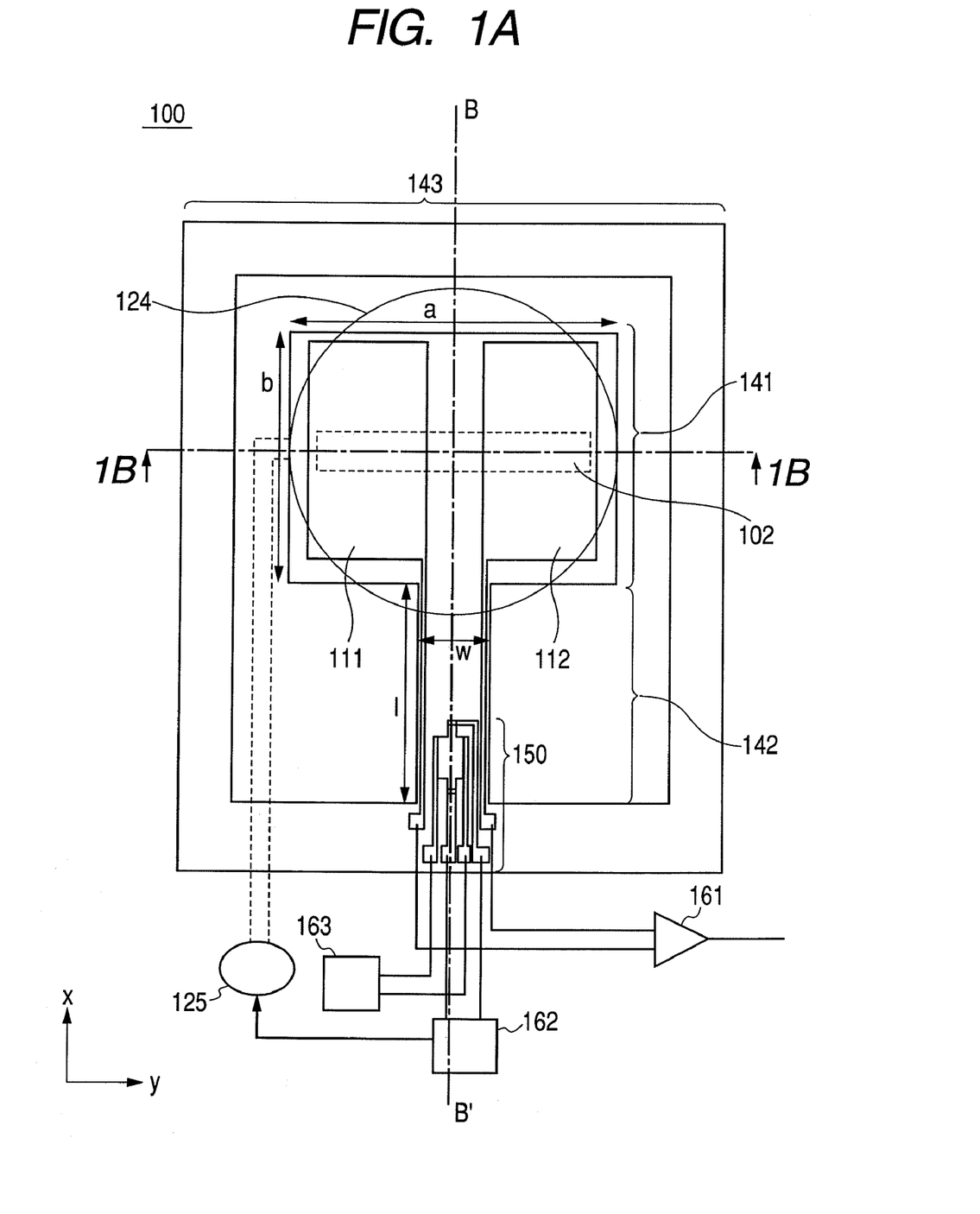
FIG. 1A is a top view illustrating the first embodiment of a potential measurement apparatus of the present invention and FIG. 1B is a sectional view taken along a 1B-1B line in FIG. 1A.
Figure 1B:
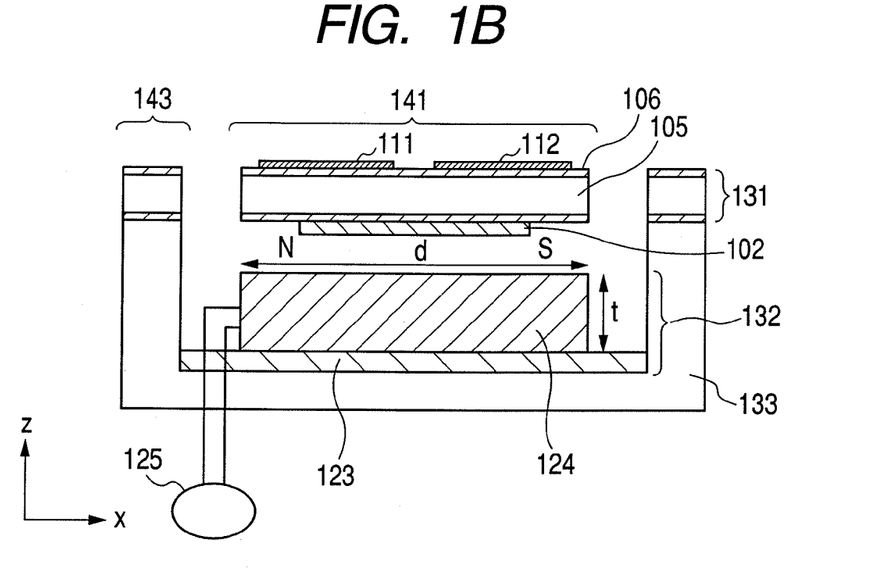

The structure of the first embodiment of a potential measurement apparatus 100 of the present invention will be described with reference to the drawings. FIG. 1A is a top view of a potential measurement apparatus and FIG. 1B is a sectional view taken along the line 1B-1B in FIG. 1A. In these views, the potential measurement apparatus 100 has a structure in which a chip part 131 produced by MEMS technology and an electromagnetic coil part 132 included in a drive mechanism are arranged in a jig 133. The structure has a size 15 by 10 by 5 mm.

The chip part 131 will be described with reference to FIG. 1A and FIG. 1B. In these drawings, the measurements are indicated in an exaggerated manner for the purpose of illustration. The chip part 131 is composed of an oscillator 141, a torsion spring 142 which is an elastic supporting part and a bearing member 143 which is a bearing part. The oscillator 141 is supported by the bearing member 143 through the torsion spring 142. The bearing member 143 is fixed to the jig 133. The measurements of the respective parts are, for example, width a=1.1 mm and length b=1.3 mm for the oscillator 141, and length l=1.1 mm and width w=0.08 mm for the torsion spring 142.

The oscillator 141, the torsion spring 142 and the bearing member 143 are integrated into one body by a substrate 105. The substrate 105 is constituted of, for example, single-crystal silicon. The single-crystal silicon has excellent mechanical properties such as small Young's modulus, small specific gravity and no plastic deformation, and therefore, can cause the oscillator 141 to have a large resonance frequency. A film of silicon dioxide 106 is formed on each of the front and rear surfaces of the substrate 105 to electrically insulate the front and rear surfaces of the chip part 131 from the substrate 105. Thickness of the silicon dioxide 106 is, for example, 1 μm.

The bearing member 143, the torsion spring 142 and the oscillator 141 are made of silicon and, therefore, can be produced by means of the semiconductor process and accurately processed. Thereby, the bearing member 143, the torsion spring 142 and the oscillator 141 can be highly accurately produced at a relatively low cost.

On the surface of the chip part 131, detection electrodes 111 and 112 are so arranged as to be symmetrical with respect to the axis B-B' passing the center axis of the torsion spring 142. The detection electrodes 111 and 112 are formed by forming on the silicon dioxide 106 films of titanium (10 nm thick), platinum (10 nm thick) and gold (300 nm thick). The detection electrodes 111 and 112 have, for example, a size 1.0 by 0.5 mm. The detection electrodes 111 and 112 are connected to a differential amplifier 161 included in a signal detection unit.

A rod-like permanent magnet 102 constituting a drive mechanism together with the electromagnetic coil part 132 is arranged in the center of the rear surface of the oscillator 141 along the line 1B-1B. The polarity of the permanent magnet 102 includes north and south poles interposing the axis B-B' therebetween as illustrated in FIG. 1B. Unlike the illustrated polarity, the north and south poles may be reversed. The permanent magnet 102 is made of a material produced by magnetizing a hard magnetic material such as samarium cobalt, Neodymium-Iron-Boron, etc.

The electromagnetic coil part 132 will be described further. In the present embodiment, the electromagnetic coil part 132 includes an electromagnetic coil 124 and an electromagnetic coil substrate 123. The wiring is circularly wound along the X-Y plane to form the electromagnetic coil 124. Power is supplied from an electromagnetic coil current source 125, and one of the north and south poles appears on one of the upper and lower surfaces of the electromagnetic coil 124 according to the current direction. The wiring of the electromagnetic coil 124 is made of a low resistance metal such as copper and aluminum. The number of turns is from several tens to several hundreds. The measurements of the electromagnetic coil 124 are, for example, diameter d=3 mm and height h=2 mm. The electromagnetic coil substrate 123 is made of a hard magnetic material such as iron and Permalloy (trade name) and plays a role of bearing the electromagnetic coil 124 and a role of shielding the magnetic field occurring from the electromagnetic coil 124 at the substrate 123 to concentrate the magnetic field upward.

Figure 2A:
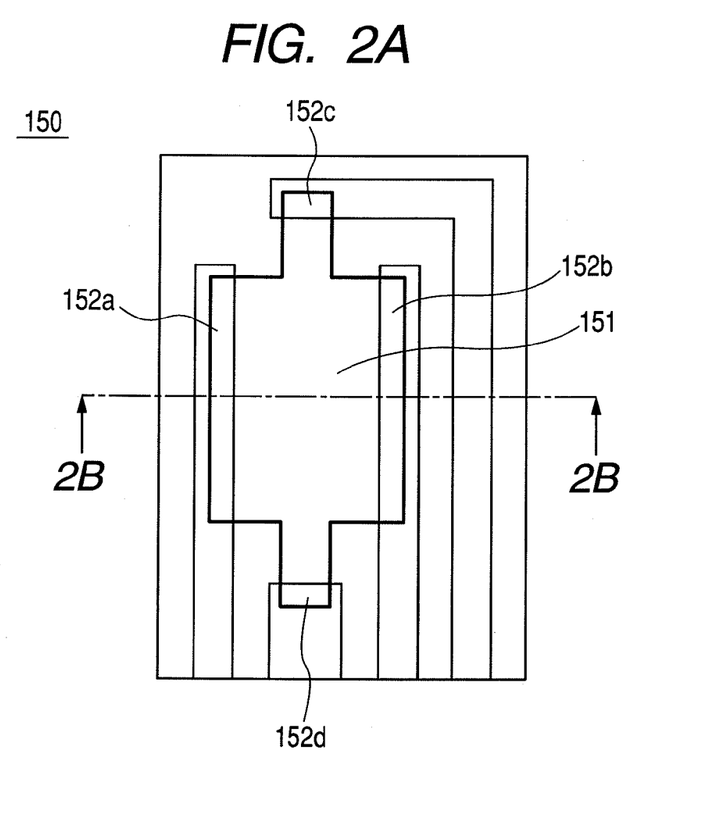
FIG. 2A is an enlarged top view of a piezoresistive element and FIG. 2B is an enlarged sectional view taken along the line 2B-2B in FIG. 2A.
Figure 2B:
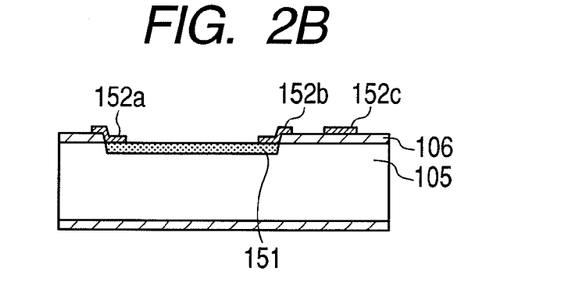

As a stress detecting element generating signals according to the stress of the elastic suspension part, a piezoresistive element 150 is located in a portion on the torsion spring 142 where the largest deformation of the torsion spring 142 takes place. The portion undergoing the largest deformation is a site as close as possible to the part connected to the bearing member 143 on the torsion spring 142. FIG. 2A is an enlarged plan view of the piezoresistive element 150. FIG. 2B is a sectional view taken along the line 2B-2B in FIG. 2A. The piezoresistive element 150 is composed of piezoresistance 151, piezoresistive electrodes 152a, 152b, 152c and 152d. The piezoresistance 151 is produced by diffusing an impurity element such as phosphorus in the single-crystal silicon in the substrate 105, and therefore, can be easily produced at a lost cost. The piezoresistance 151 has a size, for example, 90 by 40 μm. The piezoresistive electrodes 152c and 152d are connected to a stress measurement unit 162. The piezoresistive electrodes 152a and 152b are connected to a piezoresistive current source 163.

The piezoresistive element 150 and the torsion spring 142 are integrally formed, and therefore, the stress detecting element can be easily produced at a lost cost. In addition, the stress detecting element is made of a piezoresistive element and, therefore, can be produced by a semiconductor process, and thereby, can be accurately produced at a lost cost. The structural material such as silicon is doped with a dopant such as phosphorous, boron, etc., and provided with piezoeffects, and can be used as the stress detecting element.

As for the potential measurement apparatus 100 in its entirety, the chip part 131 and the electromagnetic coil part 132 are bonded to a metal jig 133. The center of the oscillator 141 is aligned so as to substantially conform to the center of the electromagnetic coil 124 on the XY plane. The jig 133 is electrically grounded.

Next, the principle of a potential measurement method in the potential measurement apparatus 100 of the present embodiment will be described. As described in FIG. 4, the potential measurement apparatus 100 is placed opposite to the measurement object surface 121. The measurement object surface 121 is a photosensitive drum utilized for a printer, a photocopier, etc. The potential detectable with the detection electrode 111 will be described here.

Figure 4:
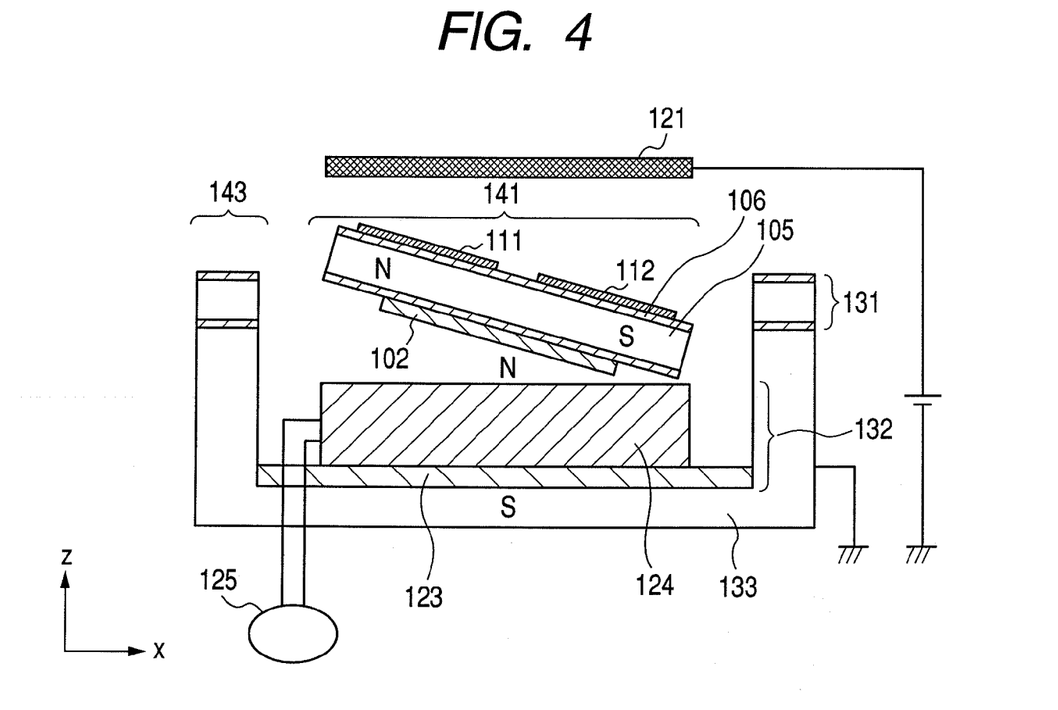
FIG. 4 is a sectional view for illustrating a potential measurement method.

In the system of the potential measurement apparatus 100 of the present embodiment, the potential of the measurement object surface 121 is a function of the current amount extracted from the detection electrode 111 and is obtained by the following expression (1):

$$i = dQ/dt = d/dt[CV] \quad (1)$$

where Q is a charge amount appearing on the detection electrode 111; C is coupling capacitance between the detection electrode 111 and the measurement object surface 121; and V is potential of the measurement object surface 121.

In addition, the capacitance C is given by the following expression (2):

$$C = AS/x \quad (2)$$

where A is a proportionality constant relating to a dielectric constant of substance, etc.; S is an area of the detection electrode 111; and x is a distance between the detection electrode 111 and the measurement object surface 121.

Using those relations, potential V of the measurement object surface 121 is measured. In order to accurately measure the charge amount Q appearing on the detection electrode 111, the amount of capacitance C between the detection electrode 111 and the measurement object surface 121 is required to be periodically modulated.

Here, the distance x between the detection electrode 111 and the measurement object surface 121 is periodically changed to periodically change the capacitance C. The detection electrode is located in an appropriate position of the oscillator 141 to vibrate the oscillator 141. Thereby, the distance x between the measurement object surface 121 and the detection electrode is periodically changed to modulate the capacitance C.

Next, a drive method of the oscillator 141 will be described. When a current flows from the electromagnetic coil current source 125 to the electromagnetic coil 124, magnetic poles corresponding to the current flowing through the electromagnetic coil 124 take place on the upper and lower surfaces of the electromagnetic coil 124. In FIG. 4, the north pole is on the upper surface and the south pole is on the lower surface. The generated magnetic field H is proportional to the product of "the current I flowing through the electromagnetic coil 124" by "the number of turns N of the electromagnetic coil 124". The magnetic field H acts on the magnetic poles of the permanent magnet 102 to vibrate the oscillator 141 around the axis B-B' as a center. In this case, the generated torque T is represented by the product of magnetization m by magnetic field H. Accordingly, it is understandable that the generated torque T is proportional to the current I flowing through the electromagnetic coil 124.

FIG. 4 illustrates a state that the oscillator 141 is vibrated by the above method. The oscillator 141 is periodically vibrated so that the distance, and the capacitance, between the detection electrodes 111 and 112 and the measurement object surface 121 can be periodically changed, whereby the signal current containing information on the potential of the measurement object surface 121 can be generated. In the configuration of the present embodiment, the signal currents generated by the detection electrode 111 and the detection electrode 112 contain information on the surface potential of the measurement object surface 121 and are different in phase by 180 degrees. By processing those two signals with the differential amplifier 161, the output signals can be approximately doubled and noise affecting the detection electrode 111 and the detection electrode 112 can be removed. This measurement method is essentially the same as the method of the above described measurement principle, but is different in taking the difference between the two signals.

In that case, an alternate current is allowed to flow through the electromagnetic coil 124 by using the electromagnetic coil current source 125, to thereby continue vibrating the oscillator 141. In addition, the oscillator 141 is driven at its resonance frequency so that the amplitude amount of the oscillator 141 can be enlarged. That is, the above described capacitance significantly changes so that the signal current containing information on the potential of the measurement object surface 121 can be increased. Here, the resonant frequency is approximately 20 kHz.

The oscillator 141 and the torsion spring 142 are in a resonance state, and therefore, can be oscillated efficiently with less drive force. Therefore, the energy consumed for driving can be saved and the apparatus can be miniaturized.

Next, a method of detecting the deflection angle displacement of the oscillator 141 with the piezoresistive element 150 will be described. When the oscillator 141 is vibrated by the drive mechanism, the torsion spring 142 twists to thereby generate shear stress. The piezoresistance 151 has the property of changing the electric resistance corresponding to the level of stress. In the structure as in the piezoresistive element 150, when current i is allowed to flow between the piezoresistive electrodes 152a-152b, potential difference E generated between the piezoresistive electrodes 152c-152d is derived by the following expression (3):

$$E = i\rho\sigma\pi \quad (3)$$

where E represents a difference in potential; i represents a current; $\rho$ represents electric resistance; $\sigma$ represents stress; and $\pi$ represents a piezoresistive coefficient.

That is, the potential difference E is a function of stress s. The stress can be detected by measuring the potential difference E with the stress measurement unit 162. In addition, the piezoresistive element p is anisotropic with respect to the crystal direction of silicon. In the case of the present embodiment, the direction of the current between the piezoresistive electrodes 152a-152b is adjusted to the <111> direction. The direction of the electric field between the piezoresistive electrodes 152c-152d is adjusted to the <110> direction. Thereby, the piezoresistive coefficient p becomes maximum with respect to the shear stress on the surface of the torsion spring 142. Then, only the displacement of the oscillator 141 will become highly sensitively detectable.

Figure 3A:
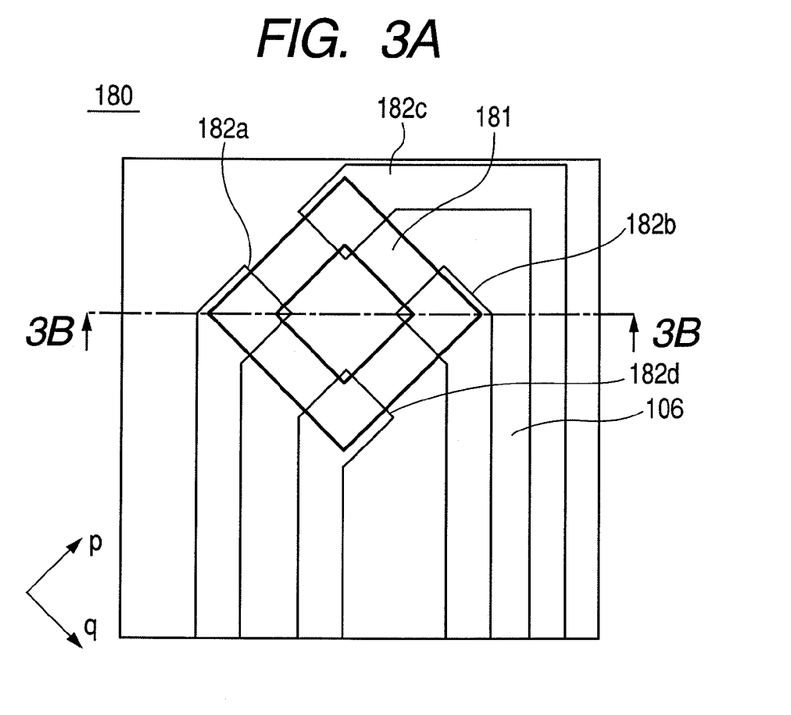
FIG. 3A is an enlarged top view of a bridge type piezoresistive element and FIG. 3B is an enlarged sectional view taken along the line 3B-3B in FIG. 3A.
Figure 3B:
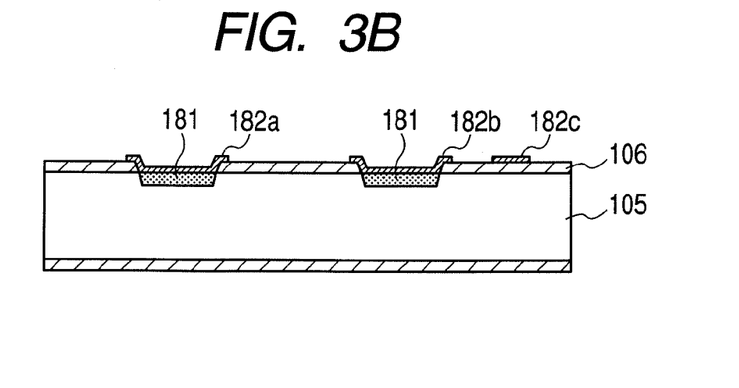

Next, a method of detecting stress of the torsion spring 142 in the case of replacing the piezoresistive element 150 with a bridge type piezoresistive element 180 will be described. FIG. 3A is a top view of a bridge type piezoresistive element 180. FIG. 3B is a sectional view taken along the line 3B-3B in FIG. 3A. The bridge type piezoresistive element 180 includes at least four bridge type piezoresistance 181 and bridge type piezoresistive electrodes 182a, 182b, 182c and 182d, which are arranged as a Wheatstone bridge shown in FIG. 3A. The bridge type piezoresistive element 180 is located, as in the piezoresistive element 150, in the portion where the stress of the torsion spring 142 becomes maximum and is connected to the stress measurement unit 162 and the piezoresistive current source 163.

When the piezoresistive current source 163 causes the current i to flow between the bridge type piezoresistive electrodes 182a-182b, the potential difference E generated between the bridge type piezoresistive electrodes 182c-182d is derived by the expression (3). Accordingly, as with the case of the piezoresistive element 150, the torsion of the torsion spring 142 can be detected with the stress measurement unit 162. Moreover, with the arrangement of the bridge type piezoresistive element 180, a difference in shear stress in the p and q directions is detected. Therefore, the detection can be carried out without being affected by a change in the electrical resistance p due to a change in temperature so that the displacement of the oscillator 141 can be detected with higher sensitivity.

Thus, at least four piezoresistive elements are provided and are arranged to form a bridge structure. Thereby, an output change with respect to a change in temperature occurring in the case of detecting stress can be prevented.

It will be described below how to control the current source 125 of the electromagnetic coil 124 constituting a drive mechanism when the oscillation properties of the oscillator 141 in the present embodiment are changed. By measuring the potential difference E of the piezoresistive element 150, the level of the shear stress on the surface of the torsion spring 142 can be detected and the deflection angle displacement of the oscillator 141 can be found. For example, when the oscillator 141 is sinusoidally vibrated, the potential difference E of the piezoresistive element 150 is sinusoidally varied. Thereby, the amplitude of the oscillator 141 during operation of the potential measurement apparatus 100 can be found.

Due to a change in environment when being used during operation of the potential measurement apparatus 100, the resonance frequency of the torsion spring 142 may deviate from the frequency of the drive signal of the electromagnetic coil current source 125. Thereby, even though the drive force of the electromagnetic coil 124 is constant, the amplitude of the oscillator 141 decreases. Therefore, the frequency of the drive signal of the electromagnetic coil current source 125 is suitably changed so that the amplitude of the potential difference E is adjusted to be maximum. Thus, the resonance frequency of the torsion spring 142 and the frequency of the drive signal are in consistency with each other and the potential measurement apparatus 100 continues optimum measurement of the potential of the measurement object.

Subsequently, with reference to FIGS. 5A to 5D, the production process of the chip part 131 will be described. Here, measurements are indicated in an exaggerated manner in order to make the process easily understandable.

Figure 5A:
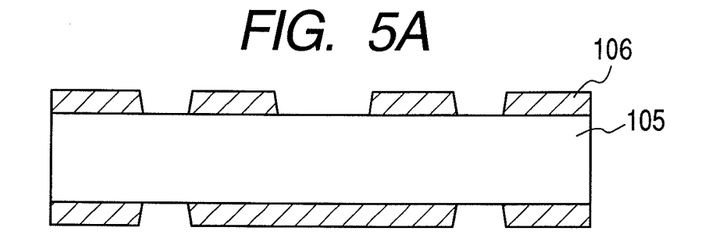
FIGS. 5A, 5B, 5C and FIG. 5D are sectional views illustrating an example of a method for producing the potential measurement apparatus of the present invention.

(1) Using, for example, a thermal oxidation furnace, a film of about 1 μm in thickness made of silicon dioxide 106 is formed on the both sides of the substrate 105 (thickness: about 200 μm) whose material is single-crystal silicon. A pattern is formed on both sides by means of wet etching using hydrofluoric acid (FIG. 5A).

Figure 5B:
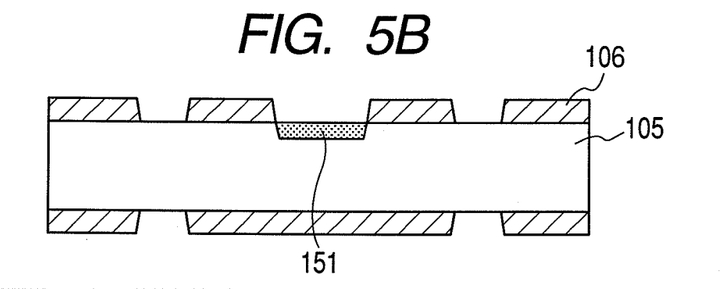

(2) The front surface is doped with an impurity such as phosphorous by a thermal diffusion method or an ion implantation method to produce piezoresistance 151 (FIG. 5B).

Figure 5C:
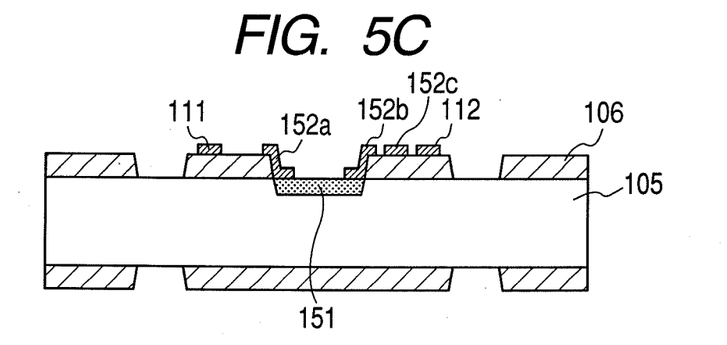
Figure 5D:
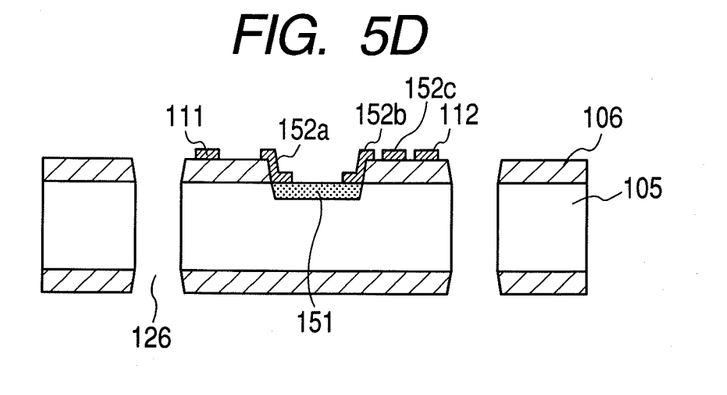

(3) A film of about 100 Å in thickness of titanium is formed as an electrode on the silicon dioxide 106 and the piezoresistance 151 on the surface. Thereafter, a film of about 100 Å in thickness of platinum is formed. Moreover, a film of about 3000 Å in thickness of gold is formed. The film formation is carried out by means of a method such as deposition or sputtering. Next, a pattern is formed by a method such as wet etching using an iodine solution, reactive ion etching (RIE) or ion milling, to thereby form the detection electrodes 111 and 112 and the piezoresistive electrode 152 (FIG. 5C).

(4) A stick-on substrate (not shown in the drawing) is adhered onto the surface of the front substrate 105. Next, the bearing substrate 105 made of silicon is subjected to reactive ion etching (RIE) using inductively coupled plasma and a Bosch process with the silicon dioxide 106 as a mask, from the rear surface, to thereby form an opening 126. In this case, the stick-on substrate functions as an etching stopper. Thereafter, the stick-on substrate is removed (FIG. 5D) Here, the Bosch process is of a system of alternately supplying etching gas and side-wall protection gas and switching between etching and side-wall protection, to thereby etch silicon selectively and with good anisotropy. The RIE of such a system is used to enable the opening 126 with vertical side walls to be formed.

(5) A wire rod of 0.2 mm in diameter and 1.0 mm in length made of hard magnetic material is adhered and magnetized to produce a permanent magnet 102 (not shown in the drawing).

Such a producing method includes a step of forming a stress detecting element in the torsion spring, a step of forming a detection electrode in the oscillator, a step of forming an opening in a bearing member, and a step of forming a magnetic field generating unit in the oscillator. In addition, an apparatus can be produced using a semiconductor process. Therefore, the oscillator, the torsion spring and the detection electrode can be formed with high accuracy and at low costs, and a potential measurement apparatus with high stability can be provided.

As described above, according to the configuration of the present embodiment, the torsion spring is provided with a stress detecting element generating electrical signals according to stress, and a stress measurement unit connected to the stress detecting element is provided, so that the drive frequency can be caused to follow the change of the resonance frequency of the oscillator. In addition, the resonance movement of the oscillator can be maintained. The deflection angle displacement of the oscillator is kept approximately maximum, so that highly accurate potential measurement become sustainable and stable operation can be performed over a long period.

In the above configuration, the detection electrode may be single. In this case, one detection electrode is arranged closer to one side of the center axis (axis B-B') of torsional motion. The method of processing electrical signals from the detection electrode is different from the above described method. Specifically, in the case where the detection electrode is single, the effects of processing the signals with the differential amplifier 161 will become unobtainable. In addition, a configuration can be adopted in which two torsion springs are provided on both sides interposing the oscillator therebetween. In this case, a stress detecting element is located in the same position of each of the torsion springs. Based on the electrical signals from those torsion springs (for example, the average of them is taken), the deflection angle displacement of the oscillator can be detected.

With the configuration in which one detection electrode is provided, an oscillation mode may be taken in which the oscillator is flexure-driven in the direction approximately perpendicular to the paper sheet face of FIG. 1A approximately in the center of the axis inside the paper sheet crossing the root part of the elastic supporting part (in this case, undergoing flexural deformation and not torsional deformation) connected to the bearing member. In this case, the width of the elastic supporting part can be enlarged so as to be adapted to the oscillation mode. Also in such a configuration, the root part of the elastic suspension part where the deformation becomes maximal is provided with a stress detecting element, and based on the electrical signals therefrom, the deflection angle displacement of the oscillator is detected. However, the manner of providing the stress detecting element is required to be changed depending on the mode of generating stress. Such a variation is feasible in other embodiments to be described below.

Second Embodiment

Figure 6:
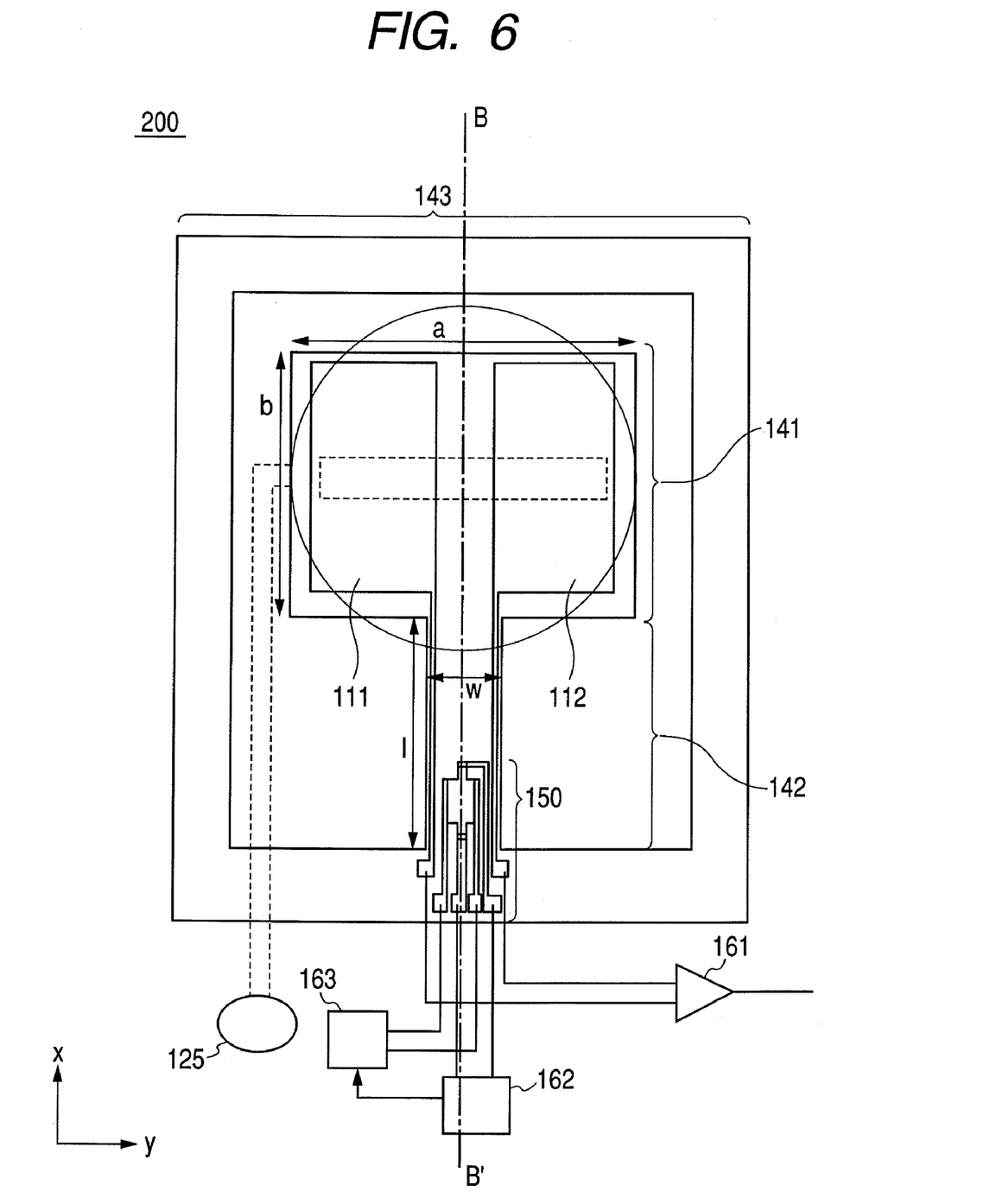
FIG. 6 is a top view for illustrating the second embodiment of the potential measurement apparatus of the present invention.

The structure of a potential measurement apparatus 200 of the second embodiment of the present invention will be described with reference to the drawings. FIG. 6 is a top view of the potential measurement apparatus 200. Also in the second embodiment, the potential measurement apparatus 200 includes a chip part 131, an electromagnetic coil part 132 and a jig 133. As for the chip part 131, the electromagnetic coil part 132 and the jig 133, the basic configuration, drive method and production method are the same as in the above described first embodiment.

In the second embodiment, one piezoresistive element 150 is used to detect the oscillation displacement of the oscillator 141 and to control the oscillation property of the torsion spring 142. The method is as follows. When the level of shear stress on the surface of the torsion spring 142 is detected, a current is allowed to flow from the piezoresistive current source 163 to the piezoresistive element 150 as described in the first embodiment. When a current is allowed to flow through the piezoresistive element 150, Joule heat is generated. Therefore, the torsion spring 142 is heated. Since the resonance frequency of the torsion spring 142 changes according to temperature, the level of the current flowing through the piezoresistive element 150 can be controlled to adjust the torsion spring 142 to the desired resonance frequency.

It will be described how to control the piezoresistive current source 163 when the oscillation property of the oscillator 141 changes. The principle of finding the amplitude of the oscillator 141 during operation of the potential measurement apparatus 100 are as described in the first embodiment. Due to a change in environment when being used during operation of the potential measurement apparatus 100, the resonant frequency of the torsion spring 142 may deviate from the frequency of the drive signal of the electromagnetic coil current source 125. Thereby, even though the drive force of the electromagnetic coil 124 is constant, the amplitude of the oscillator 141 decreases. One of the causes for changing the resonance frequency of the torsion spring 142 is a change in the spring constant due to a change in temperature of the torsion spring 142. These points are also as described in the first embodiment.

Therefore, in the second embodiment, based on the control by the stress measurement unit 162, the current value output by the piezoresistive current source 163 is suitably changed (increase and decrease) and Joule heat generated by the piezoresistive element 150 is changed. Thereby, the oscillation amplitude of the oscillator 141 is adjusted to become maximum, so that the resonant frequency of the torsion spring 142 is corrected to conform to the frequency of the drive signal of the drive mechanism. Therefore, the potential measurement apparatus 100 can continue optimum operation for potential measurement.

In the second embodiment, the piezoresistive element 150 is used also as an oscillation property control element changing the oscillation property of the oscillator 141. The piezoresistive current source 163 is used also as an oscillation property control unit connected to this oscillation property control element. Thus, as described above, the resonance frequency of the oscillator 141 changes and then is corrected to a desired resonance frequency.

In the second embodiment, the stress detecting element 150, the oscillation property control element 150 and the torsion spring 142 are integrally held together. Thereby, the stress detecting element, the oscillation property control element and the torsion spring can be easily produced at a low cost. Of course, the oscillation property control element can be provided separately from the piezoresistive element 150. Such an example includes a method in which a heater element, cooling element, etc. are located in the position of the bearing member 143 or the jig 133 fixing the bearing member. The specific example of the heater element includes an electrical resistance element and the specific example of the cooling element includes a Peltier element.

In addition, in the second embodiment, the piezoresistive current source 163 (which is connected to the stress measurement unit 162) as an oscillation property control unit controlling the oscillation property of the oscillator 141 is connected to the piezoresistive element 150. Thereby, the detection of a change in the oscillation property and the correction of the oscillation property can be carried out using one element to simplify the configuration of the apparatus. Of course, the current source of the above described oscillation property control unit can be provided separately from the piezoresistive current source 163.

Third Embodiment

Figure 7:
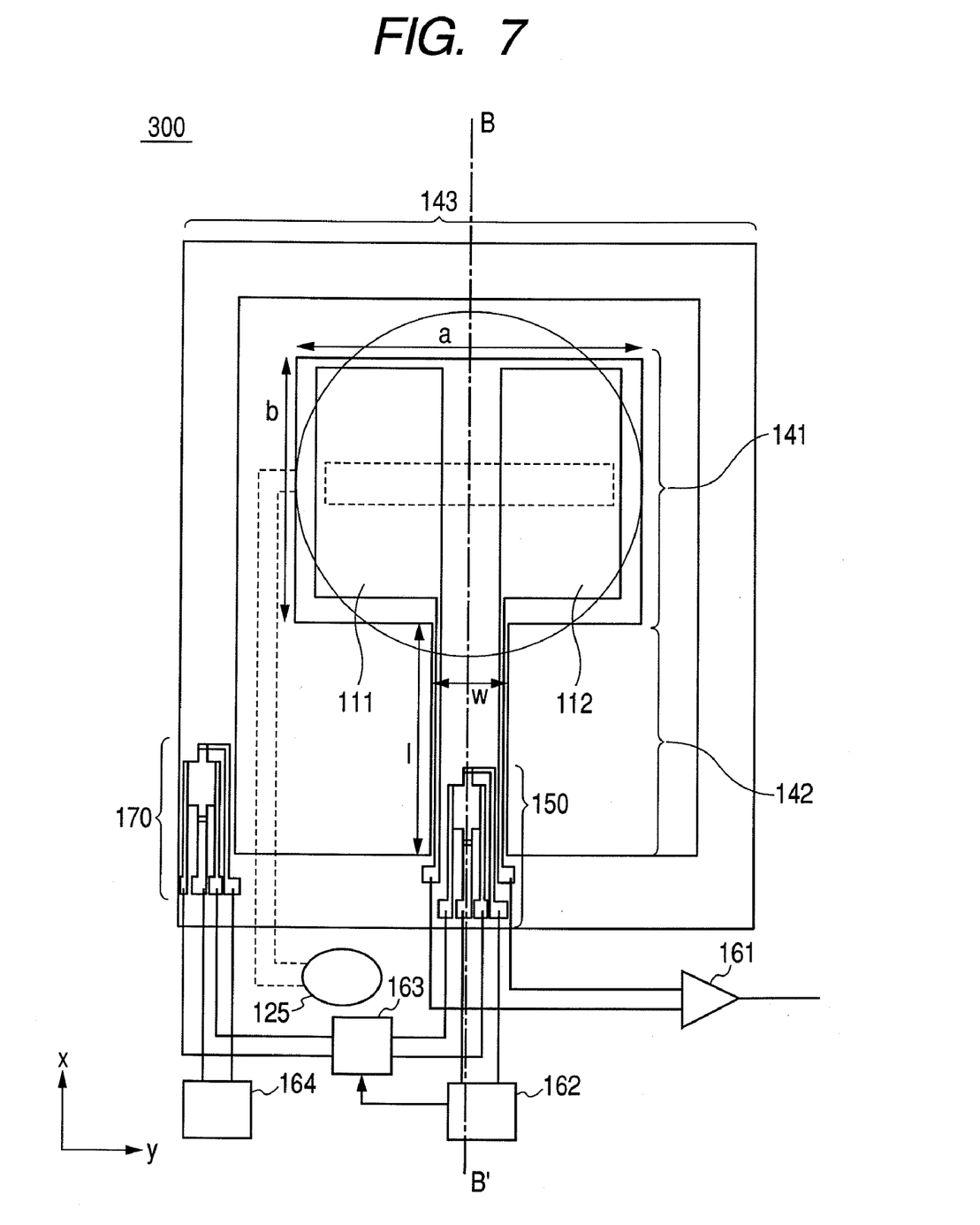
FIG. 7 is a top view for illustrating the third embodiment of the potential measurement apparatus of the present invention.

The structure of a potential measurement apparatus 300 of the third embodiment of the present invention will be described with reference to the drawings. FIG. 7 is a top view of the potential measurement apparatus 300. Also in the third embodiment, the potential measurement apparatus 300 includes a chip part 131, an electromagnetic coil part 132 and a jig 133. As for the chip part 131, the electromagnetic coil part 132 and the jig 133, the basic configuration, drive method and production method is the same as in the above described first embodiment.

In the third embodiment, a reference piezoresistive element 170 is provided. The reference piezoresistive element 170 will be described. The configuration of the electrode of the reference piezoresistive element 170 is the same as in the piezoresistive element 150. The reference piezoresistive element 170 is located in a portion on the bearing member 143 where no stress is applied. The reference piezoresistive element 170 is connected to the reference stress measurement unit 164 and the piezoresistive current source 163 to measure the potential difference E'. Since the reference piezoresistive element 170 is located in the portion where no stress is applied, the potential difference E' changes due to a factor other than stress and can be regarded as a noise component. Accordingly, the difference between the potential difference E and the potential difference E' is found, whereby the noise component can be set off so that the shear stress of the torsion spring 142 can be detected with high sensitivity. The piezoresistive current source 163 is connected to the piezoresistive element 150 and the reference piezoresistive element 170, which are supplied with the same current based on control by the stress measurement unit 162 to control the oscillation property of the oscillator 141. Alternatively, the stress measurement unit 162 is connected to the electromagnetic coil current source 125, and the drive signal of the drive mechanism can be adjusted in the same manner as in the first embodiment.

According to the third embodiment, a plurality of piezoresistive elements are included to reduce noise from the outside and detect the stress of the torsion spring 142 with higher sensitivity.

Fourth Embodiment

Figure 8:
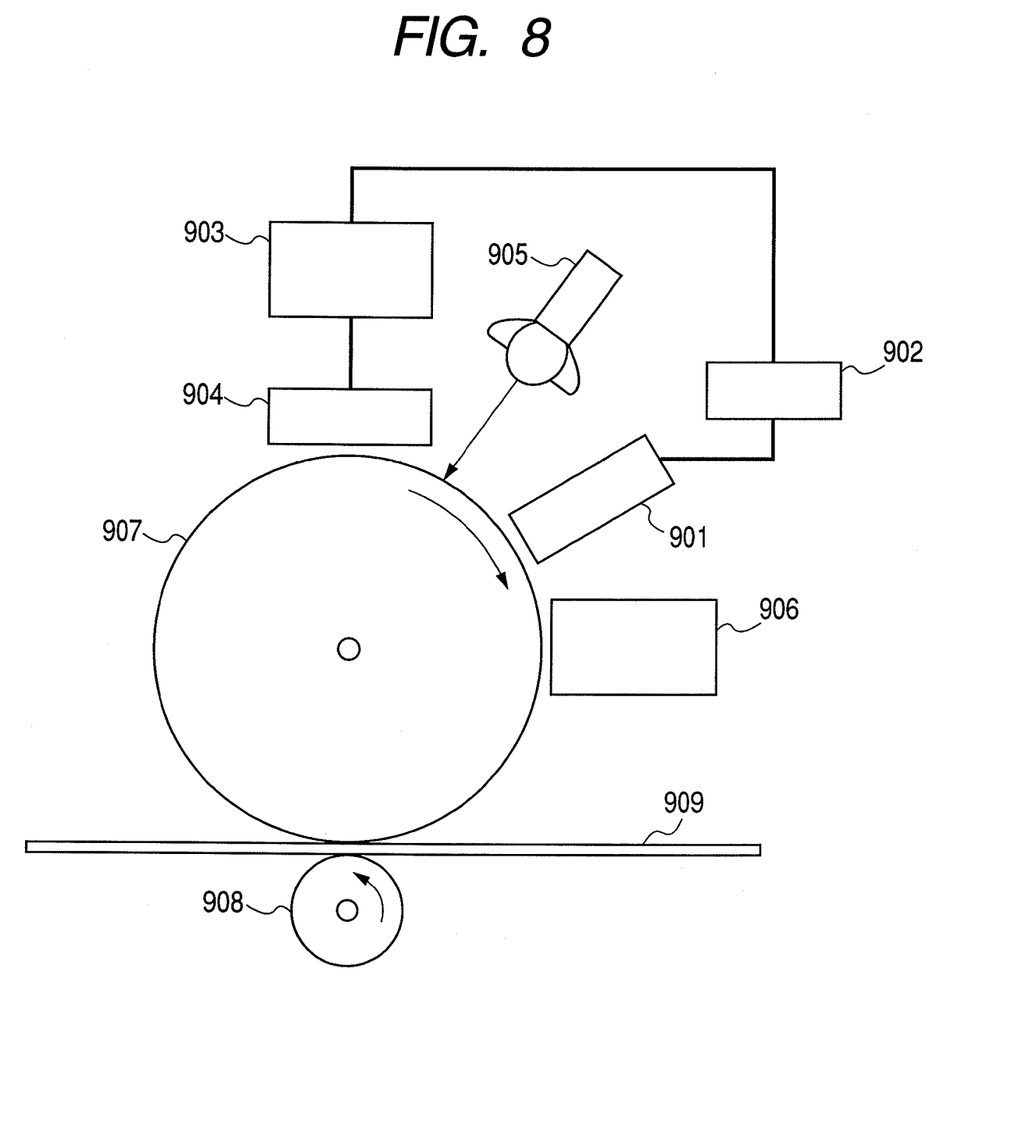
FIG. 8 is a view for illustrating an embodiment of an image forming apparatus of the present invention.

FIG. 8 is a drawing illustrating an example of a schematic configuration of an image forming apparatus in which a potential measurement apparatus of the present invention is set. The image forming apparatus includes a potential measurement apparatus 901 of the present invention, a signal processing apparatus 902, a high voltage generator 903, a charger 904, an exposure apparatus 905, a toner supply system 906, a transfer medium feeding roller 908 and a drum (whose surface is an example referred to as the measurement object surface in the present specification) 907, to form an image on a transfer medium 909.

Operations are carried out as follows. (1) The drum 907 is charged by the charger 904. (2) The charged portion is exposed by the exposure apparatus 905 to form a latent image. (3) Toner is applied to the latent image by the toner supply system 906 to form a toner image. (4) The toner image is transferred to the transfer medium 909. (5) The toner on the transfer medium 909 is melted and fixed. Through these processes, the image formation is achieved. In this configuration, the image forming unit is composed of the charger 904, the exposure apparatus 905, the photosensitive drum 907, etc.

In this case, the charge state of the drum 907 is measured by the potential measurement apparatus 901, and the result thereof is processed by the signal processing apparatus 902, and according to need, the high voltage generator 903 undergoes feedback. Thereby, the stable drum charge can be realized and stable image formation can be realized. As a series of those operations are carried out, if the oscillation property of the oscillator occasionally changes, then the charge state of the drum 907 cannot be accurately detected. When the potential measurement apparatus of the present invention is used, even if a change in the oscillation property of the oscillator occurs, the change can be adjusted, or in conformity with the change, drive signals from the drive mechanism can be controlled, so that the charge state of the drum 907 can be accurately detected. Thus, the stable charge of the photosensitive drum 907 is realized and stable image formation is achieved over a long period.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-335541, filed Dec. 13, 2006, which is hereby incorporated by reference herein in its entirety.

What is claimed is:

1. A potential measurement apparatus comprising:
a bearing part;
an elastic supporting part supported by the bearing part;
an oscillator movably supported by the elastic supporting part;
a detection electrode installed in the oscillator;
a drive mechanism driving the oscillator;
a signal detection unit connected to the detection electrode to detect an electrical signal appearing in the detection electrode;
a stress detecting element detecting an electrical signal generated according to stress of the elastic supporting part; and
a stress measurement unit connected to the stress detecting element,
wherein the stress measurement unit controls the drive mechanism on the basis of a result of a stress measurement to adjust an oscillation state of the oscillator.

2. The potential measurement apparatus according to claim 1, further comprising an oscillation property control element which changes an oscillation property of the oscillator.

3. The potential measurement apparatus according to claim 2, further comprising an oscillation property control unit connected to the oscillation property control element, wherein the stress measurement unit controls the oscillation property control element through the oscillation property control unit on the basis of a result of the stress measurement to adjust the oscillation state of the oscillator.

4. The potential measurement apparatus according to claim 3, wherein the stress detecting element functions as the oscillation property control element.

5. The potential measurement apparatus according to claim 1, further comprising at least four stress detecting elements, arranged to form a bridge structure.

6. The potential measurement apparatus according to claim 1, further comprising a plurality of stress detecting elements, wherein at least one of the stress detecting elements is located in the elastic supporting part and at least one of the stress detecting elements is located in the bearing part.

7. The potential measurement apparatus according to claim 1, wherein the stress detecting element comprises a piezoresistive element.

8. An image forming apparatus comprising the potential measurement apparatus according to claim 1 and an image forming unit, wherein the image forming unit controls image formation by using a signal resulting from the potential measurement apparatus.

* * * * *